(12) United States Patent
Matsumoto et al.

(10) Patent No.: US 10,418,541 B2
(45) Date of Patent: Sep. 17, 2019

(54) MAGNETOSTRICTIVE TORQUE SENSOR

(71) Applicant: YAMAHA HATSUDOKI KABUSHIKI KAISHA, Iwata-shi, Shizuoka (JP)

(72) Inventors: Hiroshi Matsumoto, Iwata (JP); Satomi Ishikawa, Iwata (JP)

(73) Assignee: YAMAHA HATSUDOKI KABUSHIKI KAISHA, Iwata-Shi, Shizuoka (JP)

( * ) Notice: Subject to any disclaimer, the term of this patent is extended or adjusted under 35 U.S.C. 154(b) by 0 days.

(21) Appl. No.: 15/942,183

(22) Filed: Mar. 30, 2018

(65) Prior Publication Data

US 2018/0226565 A1    Aug. 9, 2018

Related U.S. Application Data

(63) Continuation-in-part of application No. PCT/JP2016/079155, filed on Sep. 30, 2016.

(30) Foreign Application Priority Data

Oct. 1, 2015   (JP) .................. 2015-196278

(51) Int. Cl.
*G01L 3/00*    (2006.01)
*H01L 41/12*    (2006.01)
(Continued)

(52) U.S. Cl.
CPC .............. *H01L 41/125* (2013.01); *B62D 6/10* (2013.01); *G01L 3/10* (2013.01); *G01L 3/102* (2013.01);
(Continued)

(58) Field of Classification Search
CPC ........... H04L 41/125; B62D 6/10; G01L 3/10; G01L 3/102; G01L 3/103; G01L 3/105; H02N 2/181; B62M 6/50
(Continued)

(56) References Cited

U.S. PATENT DOCUMENTS 3,419,776 A * 12/1968 Kuris .................... B06B 1/0261
                                                          310/26
4,833,926 A *  5/1989 Todoroki ................ G01L 3/102
                                                          73/862.041
(Continued)

FOREIGN PATENT DOCUMENTS

EP          2112486 A1   10/2009
JP        H2-154128 A    6/1990
(Continued)

*Primary Examiner* — Max H Noori
(74) *Attorney, Agent, or Firm* — Rabin & Berdo, P.C.

(57) ABSTRACT

A low-cost magnetostrictive torque sensor having a high sensitivity is obtained. A torque sensor 10 includes a substrate 12, a magnetostrictive portion 26, a magnetostrictive portion 28, a detection coil 18a, a detection coil 18b, a detection circuit 48, and a detection circuit 50. The substrate 12 has a tubular shape. Each of the magnetostrictive portions 26 and 28 is constituted by a plating film and disposed on the outer peripheral surface of the substrate 12. The detection coil 18a generates a magnetic flux passing through the magnetostrictive portion 26. The detection coil 18b generates a magnetic flux passing through the magnetostrictive portion 28. Each of the detection circuits 48 and 50 detects a potential between the detection coil 18a and the detection coil 18b.

5 Claims, 6 Drawing Sheets

(51) Int. Cl.
  *G01L 3/10* (2006.01)
  *B62D 6/10* (2006.01)
  *H02N 2/18* (2006.01)
  *B62M 6/50* (2010.01)

(52) U.S. Cl.
  CPC .............. *G01L 3/103* (2013.01); *G01L 3/105* (2013.01); *H02N 2/181* (2013.01); *B62M 6/50* (2013.01)

(58) Field of Classification Search
  USPC .................................................... 73/862.333
  See application file for complete search history.

(56) References Cited

U.S. PATENT DOCUMENTS

| | | | |
|---|---|---|---|
| 4,979,399 A * | 12/1990 | Klauber | G01L 3/102 73/862.333 |
| 5,131,281 A | 7/1992 | Utsui et al. | |
| 5,608,318 A | 3/1997 | Yasui | |
| 5,850,045 A * | 12/1998 | Harada | G01L 3/102 73/862.333 |
| 6,422,095 B1 * | 7/2002 | Shimizu | G01L 3/102 73/862.335 |
| 6,595,074 B2 * | 7/2003 | Shimizu | B62D 5/0406 180/443 |
| 2005/0264305 A1 | 12/2005 | Seto | |
| 2007/0227268 A1 * | 10/2007 | Ouyang | G01L 3/102 73/862.333 |
| 2007/0245833 A1 | 10/2007 | Yoneda et al. | |
| 2007/0283768 A1 | 12/2007 | Yoneda et al. | |
| 2014/0326077 A1 | 11/2014 | Yoneda et al. | |

FOREIGN PATENT DOCUMENTS

| | | |
|---|---|---|
| JP | 2001-336995 A | 12/2001 |
| JP | 2002-139390 A | 5/2002 |
| JP | 2005-241433 A | 9/2005 |
| JP | 2006-017701 A | 1/2006 |
| JP | 2007-114088 A | 5/2007 |
| JP | 2009-128155 A | 6/2009 |

* cited by examiner

MAGNETOSTRICTIVE TORQUE SENSOR

CROSS-REFERENCES TO RELATED APPLICATIONS

The present application is a continuation-in-part application of International Application No. PCT/JP2016/079155, filed on Sep. 30, 2016, and having the benefit of the earlier filing date of Japanese Application No. 2015-196278, filed on Oct. 1, 2015. The content of each of the identified applications is incorporated herein by reference in its entirety.

TECHNICAL FIELD

The present teaching relates to a magnetostrictive torque sensor.

BACKGROUND ART

A magnetostrictive torque sensor has been conventionally used for detecting a torque applying on a component of equipment. A known configuration example of a magnetostrictive torque sensor includes: a columnar substrate having an outer peripheral surface on which a pair of magnetostrictive portions is provided; and a pair of coils that generates a magnetic flux passing through the pair of magnetostrictive portions. In the magnetostrictive torque sensor having such a configuration, when a force in a rotation direction is applied to the substrate, a tensile stress occurs in one of the pair of magnetostrictive portions, and a compressive stress occurs in the other magnetostrictive portion. Accordingly, magnetic permeabilities of the pair of magnetostrictive portions change. The force applying on the substrate is detected by detecting changes of magnetic permeabilities of the pair of magnetostrictive portions.

An amorphous alloy can be used as the magnetostrictive portions, for example. Patent Document 1, for example, discloses: a torque detector including a columnar or tubular torque transfer unit having an outer peripheral surface on which a magnetostrictive effect portion is formed; and a pair of coils. In the torque detector disclosed in Patent Document 1, amorphous alloy foil is attached as the magnetostrictive effect portion to the outer peripheral surface of the torque transfer unit.

CITATION LIST

Patent Document

Patent Document 1: Japanese Patent Application Publication No. 2002-139390

SUMMARY OF INVENTION

Technical Problem

As disclosed in Patent Document 1, the magnetic permeability of an amorphous alloy changes more greatly in the case of application of compressive deformation to the amorphous alloy than in the case of application of tensile deformation. Thus, in the torque detector of Patent Document 1, the amorphous alloy foil is attached to the outer peripheral surface of the torque transfer unit using an adhesive with biaxial isotropic compressive deformation applied to the amorphous foil. Accordingly, a torque detector having high sensitivity is supposed to be obtained.

To attach the amorphous alloy foil under application of biaxial isotropic compressive deformation to the torque transfer unit with high accuracy, a high level of fabrication technique is needed.

It is therefore an object of the present teaching to provide a magnetostrictive torque sensor that has high sensitivity which can be easily fabricated.

Solution to Problem

Inventors of the present teaching considered the formation of a magnetostrictive portion using a material other than an amorphous alloy foil in order to ease fabrication of a magnetostrictive torque sensor. Specifically, the inventors considered the use of a plating film as a magnetostrictive portion.

However, a magnetostrictive torque sensor including a magnetostrictive portion constituted by a plating film requires strict control of a formation process of the plating film in order to obtain a sensitivity, which is substantially equal to that of a magnetostrictive torque sensor including a magnetostrictive portion constituted by amorphous alloy foil. Specifically, in the magnetostrictive torque sensor including the magnetostrictive portion constituted by the plating film, it is necessary to strictly control an alloy composition in the plating film. In this case, it is difficult to ease fabrication of the magnetostrictive torque sensor including the magnetostrictive portion constituted by the plating film. On the other hand, in the case of forming a plating film placing a priority on easiness of fabrication of the torque sensor, it is difficult to avoid a decrease in the sensitivity of the magnetostrictive torque sensor.

In view of this, the inventors of the present teaching tried to increase sensitivity of a magnetostrictive torque sensor by using a configuration other than a magnetostrictive portion. To increase the sensitivity of the magnetostrictive torque sensor, it can be effective to increase a magnetic flux generated by coils, for example. An increase of the magnetic flux generated by coils can be achieved by increasing the number of turns of coils while keeping a current value.

The increase in the number of turns of coils, however, increases fabrication costs. Thus, the inventors tried to increase the sensitivity of the magnetostrictive torque sensor by adjusting a current flowing in the coils. Through investigation of a relationship between a current flowing in the coils and the sensitivity of the magnetostrictive torque sensor, the inventors found that even with the same current value of a current flowing in the coils, the sensitivity of the magnetostrictive torque sensor varies depending on the frequency of the current.

The inventors also found that in some frequency ranges of the current flowing in the coils, the sensitivity of the magnetostrictive torque sensor including the magnetostrictive portion constituted by the plating film is, in some cases, higher than the sensitivity of a magnetostrictive torque sensor including the magnetostrictive portion constituted by amorphous alloy foil. Specifically, it was found that in the magnetostrictive torque sensor including the magnetostrictive portion constituted by the plating film, even with the same current value of a current flowing in the coils, the sensitivity can be increased by reducing the frequency of the current in some cases.

Based on the foregoing findings, the inventors tried to increase the sensitivity of the magnetostrictive torque sensor having a configuration similar to that disclosed in Patent Document 1 by using a plating film as a magnetostrictive portion instead of amorphous alloy foil. Specifically, the inventors tried to increase the sensitivity of the magnetostrictive torque sensor by adjusting the frequency of a current flowing in a pair of coils.

It was, however, found that in the case of reducing the frequency of a current flowing in the coils, impedances of the coils decrease to cause an overflow of the current in some cases. In particular, in the configuration disclosed in Patent Document 1, coils constituting a pair are connected in parallel. In such a configuration, a decrease in the frequency of a current flowing in the coils tends to increase the current value of a current flowing in each coil. Accordingly, it is difficult to adjust the frequency of a current flowing in each coil.

In view of this, the inventors studied a configuration for easing the adjustment of frequency of a current flowing in each coil in a magnetostrictive torque sensor including a pair of coils. The inventors finally found that the frequency of a current can be easily adjusted by connecting the pair of coils in series and thereby preventing an overflow of a current in each coil.

As described above, as a result of various studies by the inventors, the inventors found that even in a case where a plating film is formed placing a priority on easiness of fabrication, sensitivity of a magnetostrictive torque sensor can be increased by appropriately adjusting the frequency of a current flowing in a pair of coils. The inventors also found that the frequency of a current flowing in each coil can be easily adjusted by connecting the pair of coils in series. As a result of these findings, the inventors found that a magnetostrictive torque sensor that has high sensitivity and can be fabricated at low costs can be obtained by constituting a pair of magnetostrictive portions by a plating film and connecting a pair of coils in series.

Based on the findings described above, the inventors arrived at a configuration of a magnetostrictive torque sensor as described below.

A magnetostrictive torque sensor according to an embodiment of the present teaching includes: a substrate having columnar or tubular shape; a first magnetostrictive portion and a second magnetostrictive portion each disposed on an outer peripheral surface of the substrate and constituted by a plating film; a first coil that generates a magnetic flux passing through the first magnetostrictive portion; a second coil that generates a magnetic flux passing through the second magnetostrictive portion and is electrically connected to the first coil in series; a first resistor disposed between the first coil and the second coil and electrically connected to the first coil and the second coil in series; a second resistor disposed between the first resistor and the second coil and electrically connected to the first resistor and the second coil in series; and a detection circuit that detects a potential between the first coil and the first resistor and a potential between the second coil and the second resistor.

Advantageous Effects of Invention

A magnetostrictive torque sensor according to an embodiment of the present teaching has a high sensitivity and can be easily fabricated.

DESCRIPTION OF EMBODIMENTS

A magnetostrictive torque sensor (hereinafter referred to as a torque sensor) according to an embodiment of the present teaching will be described below.

(Schematic Configuration of Torque Sensor)

Figure 1:
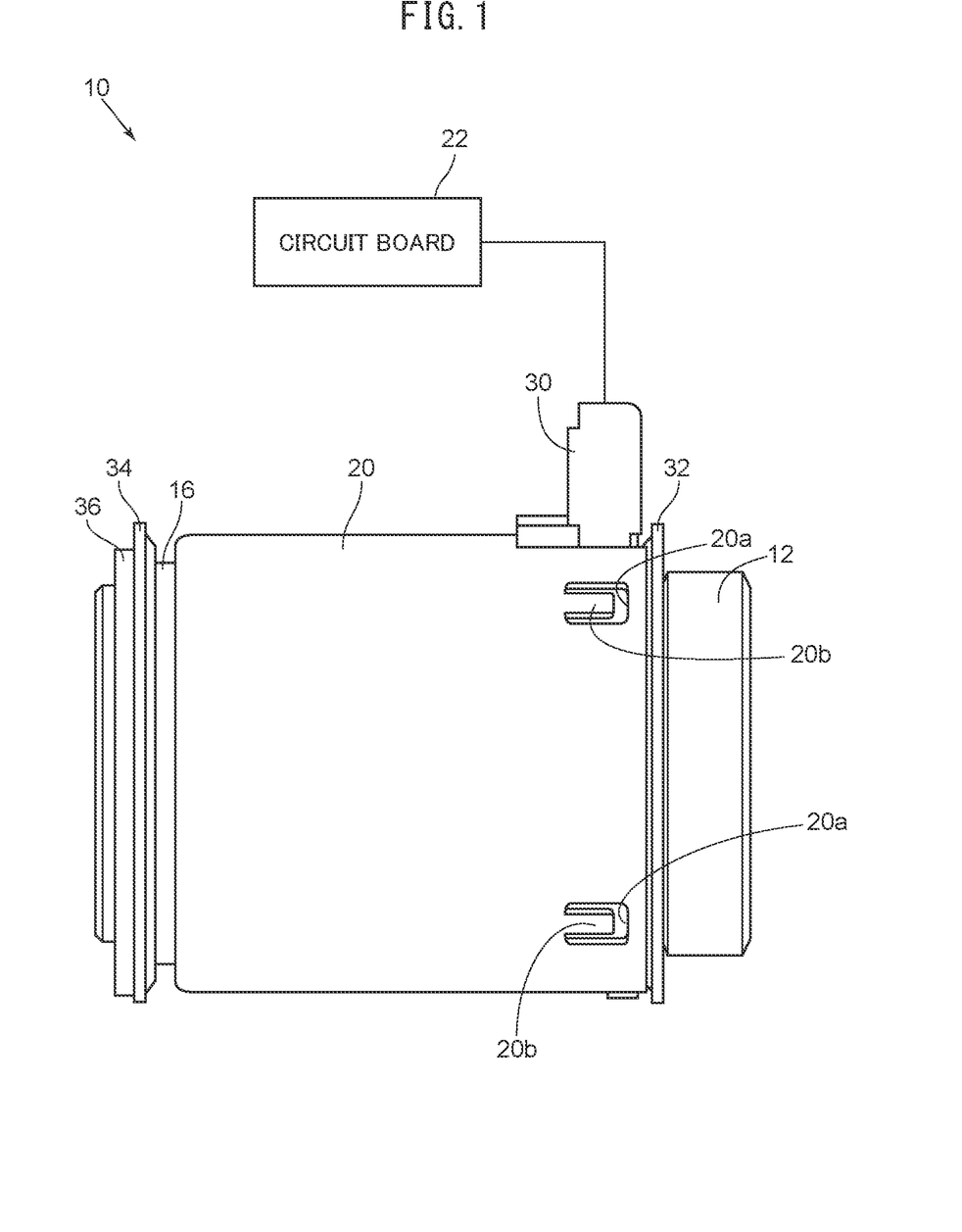
FIG. 1 is a front view illustrating a schematic configuration of a torque sensor according to an embodiment of the present teaching.
Figure 2:
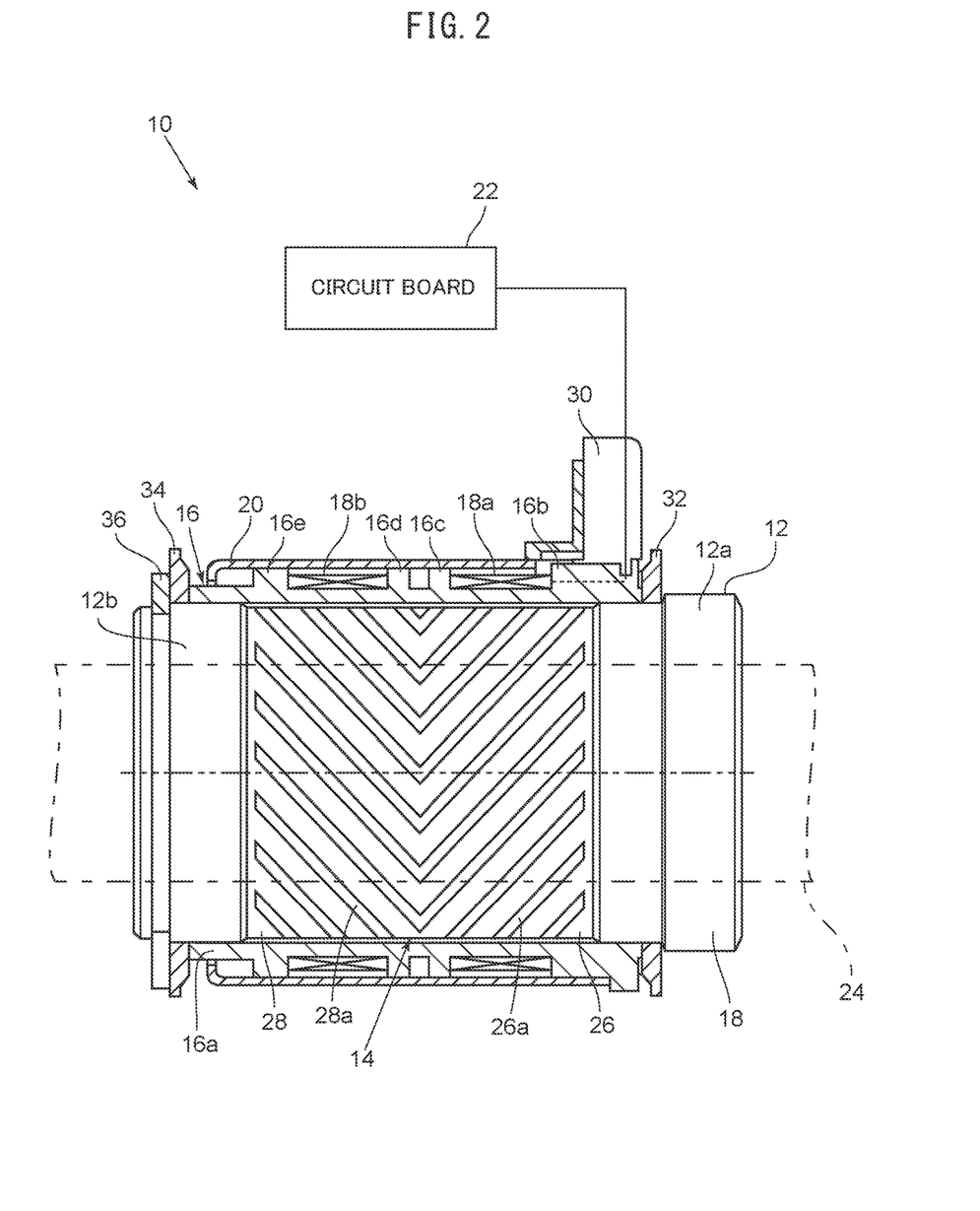
FIG. 2 is a partial cross-sectional view partially illustrating the torque sensor in cross-section.

FIG. 1 is a schematic front view illustrating a torque sensor 10 according to an embodiment of the present teaching. FIG. 2 is a partial cross-sectional view partially illustrating the torque sensor 10 in cross-section.

With reference to FIGS. 1 and 2, the torque sensor 10 includes a substrate 12, a plating film 14, a bobbin 16, a pair of detection coils 18a and 18b, a case 20, and a circuit board 22. In the torque sensor 10, when a torque applies on the substrate 12, the magnetic permeability of the plating film 14 thereby changes, which will be described in detail later. The change in the magnetic permeability of the plating film 14 is detected by the detection coils 18a and 18b. The torque sensor 10 can detect a torque applying on the substrate 12. Although not specifically described, the torque sensor 10 can be used as a torque sensor for detecting a pedaling force in a driving device of an electric motor-assisted bicycle. In this embodiment, the detection coils 18a and 18b function as a first coil and a second coil, respectively.

(Mechanical Configuration of Torque Sensor)

The substrate 12 is made of, for example, a metal material such as chromium molybdenum steel. With reference to FIG. 2, in this embodiment, the substrate 12 has a tubular shape elongated in an axial direction. In the case of using the torque sensor 10 as a torque sensor for detecting a pedaling force in an electric motor-assisted bicycle, spline grooves are formed in the outer peripheral surface of one end portion 12a of the substrate 12 in the axial direction and the inner peripheral surface of the other end portion 12b of the substrate 12 in the axial direction, for example. The one end portion 12a of the substrate 12 is connected to a chain sprocket (not shown) of the electric motor-assisted bicycle through a one-way clutch. Specifically, the one-way clutch is attached to the one end portion 12a of the substrate 12 in such a manner that the spline groove in the one end portion 12a of the substrate 12 and a spline groove (not shown) in an inner peripheral surface of the one-way clutch mesh with each other. A crank shaft 24 of the electric motor-assisted bicycle is inserted in the substrate 12. Specifically, the crank shaft 24 is inserted in the substrate 12 in such a manner that the spline groove in the other end portion 12b of the substrate 12 and a spline groove (not shown) in an outer peripheral surface of the crank shaft 24 mesh with each other. This configuration transfers a torque from the crank shaft 24 to the substrate 12.

The plating film 14 is made of a magnetostrictive material (e.g., a Fe—Ni alloy) and functions as a magnetostrictive portion. The plating film 14 is formed by, for example, electroplating. The plating film 14 is formed on the outer peripheral surface of a center portion of the substrate 12 in the axial direction so as to have a tubular shape. In this embodiment, the plating film 14 has a tubular magnetostrictive portion 26 (first magnetostrictive portion) and a magnetostrictive portion 28 (second magnetostrictive portion). The magnetostrictive portion 26 and the magnetostrictive portion 28 are disposed side by side in the axial direction of the substrate 12. In this embodiment, a plurality of slits 26a are formed in the magnetostrictive portion 26. A plurality of slits 28a are formed in the magnetostrictive portion 28. The plurality of slits 26a are arranged at regular intervals in the circumferential direction of the substrate 12. Similarly, the plurality of slits 28a are arranged at regular intervals in the circumferential direction of the substrate 12.

When viewed from the outside in the radial direction of the substrate 12, the slits 26a are tilted 45° relative to a shaft center of the substrate 12 (see the chain double-dashed line in FIG. 2). When viewed from the outside in the radial direction of the substrate 12, the slits 28a are tilted 45° in a direction different from the slits 26a relative to the shaft center of the substrate 12. That is, in this embodiment, the plurality of slits 26a and 28a are formed in the plating film 14 in such a manner that the slits 26a and the slits 28a intersect with each other perpendicularly. With this configuration, when a torque applies on the substrate 12, a compressive stress occurs in one of the magnetostrictive portions 26 and 28, and a tensile stress occurs in the other magnetostrictive portion.

The bobbin 16 is made of, for example, a resin material. The bobbin 16 has a tubular shape. Specifically, the bobbin 16 includes a tubular portion 16a and a plurality of (four in this embodiment) flange portions 16b through 16e projecting from the outer peripheral surface of the tubular portion 16a outward in the radial direction of the tubular portion 16a. The flange portions 16b through 16e are arranged at intervals from one another in the axial direction of the tubular portion 16a. For example, in the case of using the torque sensor 10 as a torque sensor for detecting a pedaling force in a driving device of an electric motor-assisted bicycle, the bobbin 16 is fixed to a housing of the driving device with an unillustrated fixing member.

The detection coil 18a is wound around the tubular portion 16a between the flange portion 16b and the flange portion 16c. The detection coil 18b is wound around the tubular portion 16a between the flange portion 16d and the flange portion 16e. In this embodiment, for example, the detection coils 18a and 18b include welded layers. In the detection coils 18a and 18b, adjacent coil wires are fixed to each other by self-welding. The detection coils 18a and 18b may not include welded layers. In this case, adjacent coil wires may be fixed to each other with another technique such as impregnation.

Although not specifically described, the flange portion 16b is provided with a plurality of terminals electrically connected to the detection coils 18a and 18b. To protect these terminals, a connector 30 is attached to the flange portion 16b. These plurality of terminals are electrically connected to terminals of the circuit board 22. The circuit board 22 will be described later.

In this embodiment, the substrate 12 is rotatably supported on the inner peripheral surface of the bobbin 16. The bobbin 16 covers the plating film 14 from radially outside of the substrate 12 not to contact the plating film 14. The detection coils 18a and 18b are provided coaxially with the substrate 12, and disposed at positions facing the plating film 14 in the radial direction of the substrate 12. More specifically, in the radial direction of the substrate 12, the detection coil 18a is disposed at a position facing the magnetostrictive portion 26. In the radial direction of the substrate 12, the detection coil 18b is disposed at a position facing the magnetostrictive portion 28.

In this embodiment, the detection coils 18a and 18b are disposed in such a manner that a magnetic flux generated by the detection coil 18a and passing through the magnetostrictive portion 26 and a magnetic flux generated by the detection coil 18b and passing through the magnetostrictive portion 28 flows in one way (same direction) along the axis of the substrate 12. Specifically, in this embodiment, in a direction along the axis of the substrate 12, the distance between the detection coil 18a and the detection coil 18b is, for example, smaller than each of the length of the detection coil 18a and the length of the detection coil 18b. In this embodiment, a coupling coefficient between the detection coil 18a and the detection coil 18b is set from 0.2 to 0.6, for example.

With reference to FIGS. 1 and 2, the case 20 is made of, for example, a metal material such as low-carbon steel. The case 20 has a tubular shape. With reference to FIG. 2, the bobbin 16 is inserted in the case 20. The case 20 covers radially outsides of the detection coils 18a and 18b.

With reference to FIG. 1, one end portion of the case 20 has a plurality of through holes 20a each having a substantially U shape. The formation of the through holes 20a forms substantially rectangular swaging portions 20b. In this embodiment, the plurality of swaging portions 20b are formed at regular intervals in the circumferential direction of the case 20. The case 20 is fixed to the bobbin 16 by swaging using the plurality of swaging portions 20b.

With reference to FIGS. 1 and 2, in this embodiment, an annular protective plate 32 of a resin material is disposed to contact one end surface of the bobbin 16. An annular protective plate 34 of a resin material is disposed to contact the other end surface of the bobbin 16. In this embodiment, the protective plates 32 and 34 are provided to prevent abrasion of the one end surface and the other end surface of the bobbin 16.

A substantially C-shaped circlip 36 is disposed to restrict movement of the protective plate 34 in the axial direction of the substrate 12. In this manner, movement of the bobbin 16 relative to the substrate 12 can be prevented in the axial direction of the substrate 12. The circlip 36 is made of, for example, a metal material.

In the configuration described above, when a torque is transferred from the crank shaft 24 to the substrate 12, a compressive stress occurs in the magnetostrictive portion 26 and a tensile stress occurs in the magnetostrictive portion 28, for example. In this manner, the magnetic permeability of the magnetostrictive portion 26 decreases, and the magnetic permeability of the magnetostrictive portion 28 increases. Consequently, an impedance of the detection coil 18a decreases, and an impedance of the detection coil 18b increases. Based on changes of the impedances of the detection coils 18a and 18b, the torque sensor 10 can detect a torque applying on the substrate 12, which will be described later.

(Circuit Configuration of Torque Sensor)

Figure 3:
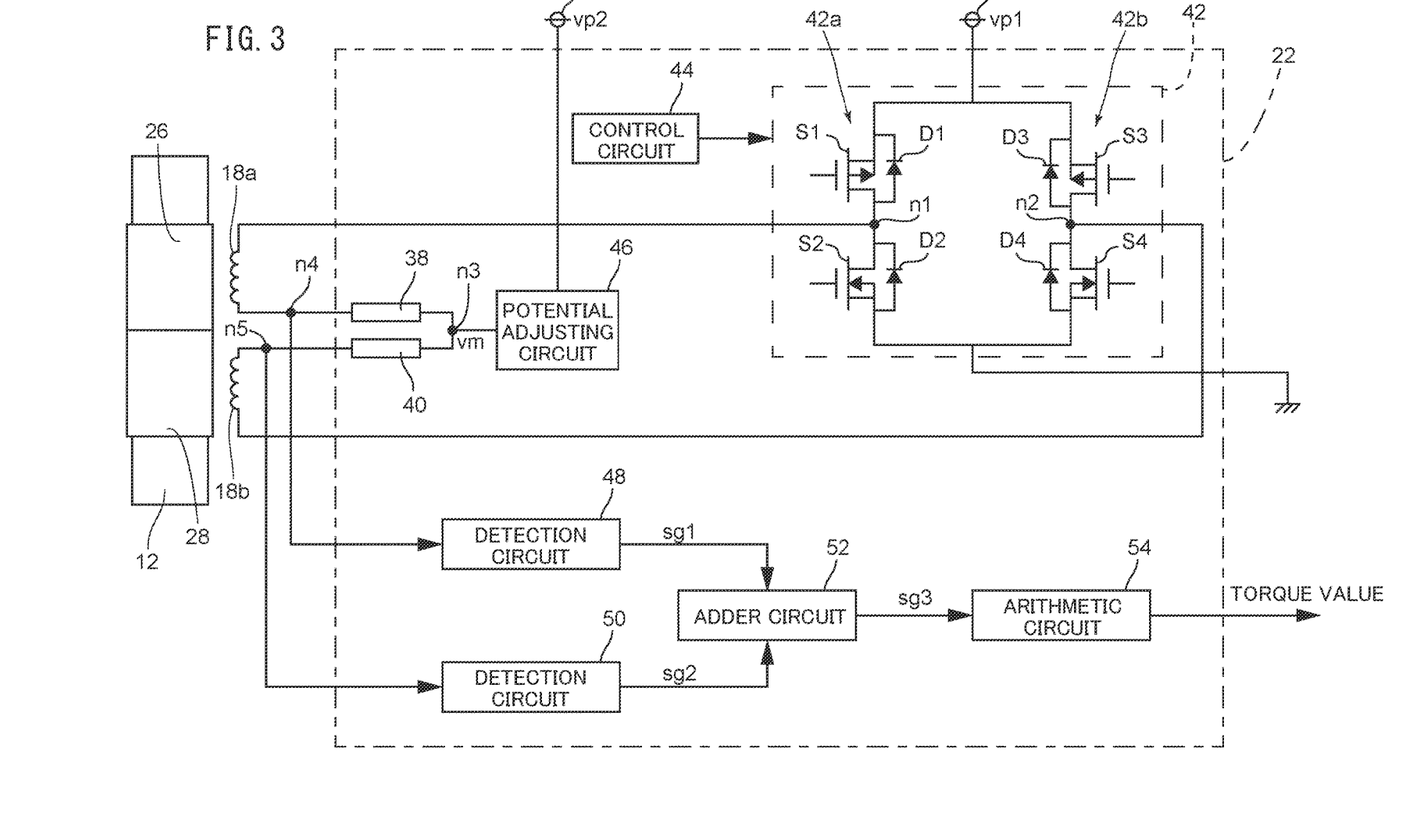
FIG. 3 is a diagram illustrating a circuit configuration of the torque sensor.

FIG. 3 is a diagram illustrating a circuit configuration of the torque sensor 10. With reference to FIG. 3, the circuit board 22 includes resistors 38 and 40, a switching circuit 42, a control circuit 44, a potential adjusting circuit 46, detection circuits 48 and 50, an adder circuit 52, and an arithmetic circuit 54. In this embodiment, the switching circuit 42 functions as a power supply section. The potential adjusting circuit 46 functions as a potential generating circuit. The detection circuits 48 and 50 function as detection circuits.

The resistor 38 (first resistor) is disposed between the detection coil 18a and the detection coil 18b and is electrically connected to the detection coils 18a and 18b in series. The resistor 40 (second resistor) is disposed between the resistor 38 and the detection coil 18b and is electrically connected to the resistor 38 and the detection coil 18b in series. In this embodiment, the resistor 38 has a resistance value smaller than a resistance value (impedance) of the detection coil 18a. The resistor 40 has a resistance value smaller than a resistance value (impedance) of the detection coil 18b.

The switching circuit 42 is connected to a power supply terminal V1. In this embodiment, a power supply voltage of a positive voltage is supplied from the power supply terminal V1 to the switching circuit 42. A potential (power supply potential) of the power supply terminal V1 is 5 V, for example. The switching circuit 42 is electrically connected to the detection coil 18a, the resistor 38, the resistor 40, and the detection coil 18b in series.

In this embodiment, the switching circuit 42 is an H-bridge circuit including two switching arms 42a and 42b connected in parallel. The switching arm 42a includes switching devices S1 and S2 and diodes D1 and D2. The switching device S1 and the switching device S2 are connected in series. The switching device S1 and the diode D1 are connected in parallel. The switching device S2 and the diode D2 are connected in parallel. The switching arm 42b includes switching devices S3 and S4 and diodes D3 and D4. The switching device S3 and the switching device S4 are connected in series. The switching device S3 and the diode D3 are connected in parallel. The switching device S4 and the diode D4 are connected in parallel. In this embodiment, p-channel MOSFETs are used as the switching devices S1 and S3. As the switching devices S2 and S4, n-channel MOSFETs are used.

A midpoint between the switching device S1 and the switching device S2 is electrically connected to an end of the detection coil 18a. A midpoint between the switching device S3 and the switching device S4 is electrically connected to an end of the detection coil 18b. In FIG. 3, a contact point among the detection coil 18a, the switching device S1, and the switching device S2 is represented as a node n1, and a contact point among the detection coil 18b, the switching device S3, and the switching device S4 is represented as a node n2.

The control circuit 44 outputs a control signal to the switching circuit 42 to thereby control switching operations (on/off operations) of the switching devices S1 through S4. Specifically, the control circuit 44 outputs a control signal so as to alternately turn on the switching devices S1 and S4 and the switching devices S2 and S3. In the present specification, the control circuit 44 may include a processor chip or circuitry within the processor chip. Embodiments may also include additional logic circuitry and other chips capable of generating control signals based on predetermined criteria, including a predetermined time interval, predetermined input signals, or any other predetermined criteria.

Figure 4A:
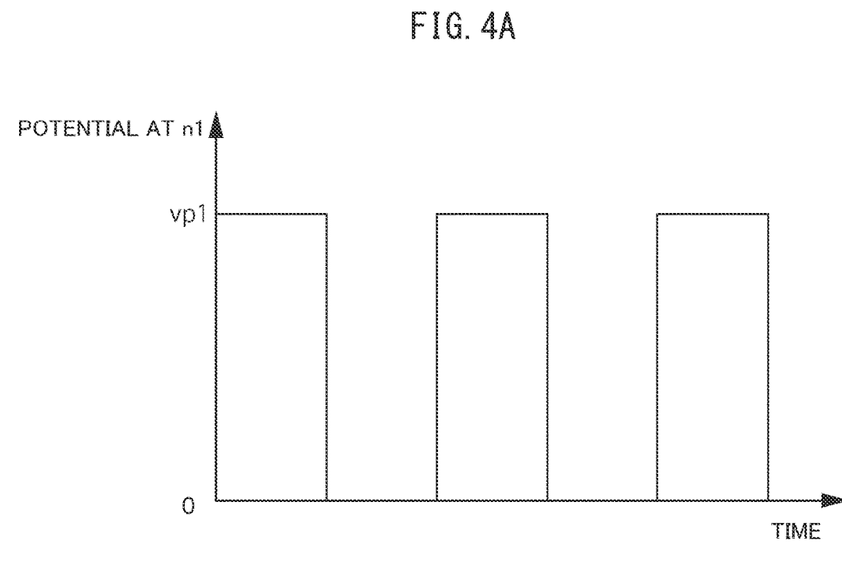
FIGS. 4A and 4B show graphs of examples of changes with time of a potential at a contact point between a detection coil and a switching device.
Figure 4B:
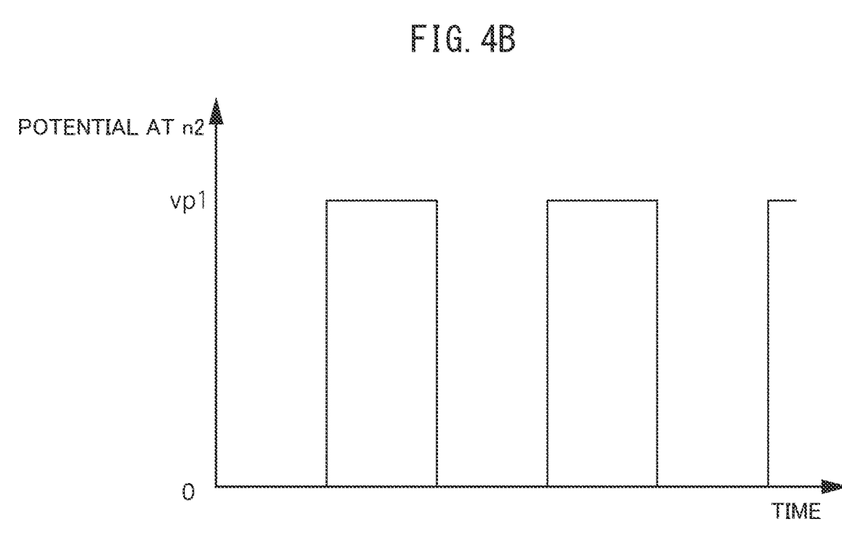

FIGS. 4A and 4B show graphs of examples of changes with time of potentials at the node n1 and the node n2. FIG. 4A shows a change with time of the potential at the node n1. FIG. 4B shows a change with time of the potential at the node n2. With reference to FIGS. 4A and 4B, switching operations of the switching devices S1 through S4 are controlled as described above so that the potentials at the node n1 and the node n2 alternately become a potential vp1 of the power supply terminal V1 and a ground potential (0 V). Consequently, an alternating current flows in the detection coil 18a, the resistor 38, the resistor 40, and the detection coil 18b. In this embodiment, the control circuit 44 outputs a rectangular signal of 1 to 2 kHz, for example, as the control signal. In this manner, an alternating current of 1 to 2 kHz flows in the detection coil 18a, the resistor 38, the resistor 40, and the detection coil 18b.

With reference to FIG. 3, the potential adjusting circuit 46 is electrically connected to a midpoint between the resistor 38 and the resistor 40 and to a power supply terminal V2. In FIG. 3, a contact point among the resistor 38, the resistor 40, and the potential adjusting circuit 46 is represented as a node n3. In this embodiment, a power supply voltage of a positive voltage is supplied from the power supply terminal V2 to the potential adjusting circuit 46.

The potential adjusting circuit 46 generates an intermediate potential vm between the potential vp1 at the power supply terminal V1 and the ground potential, and sets a potential at the node n3 at the intermediate potential vm. In this embodiment, the potential adjusting circuit 46 reduces the potential vp2 at the power supply terminal V2 to thereby generate the intermediate potential vm. For example, in a case where the potential vp1 at the power supply terminal V1 is 5 V, the potential adjusting circuit 46 reduces the potential vp2 at the power supply terminal V2 to 2.5 V so that the potential at the node n3 is set at 2.5 V. As the power supply terminal V1 and the power supply terminal V2, power supply terminals of a common power supply can be used. In this case, one power supply can be used for generating an alternating current by the switching circuit 42 and for generating the intermediate potential vm by the potential adjusting circuit 46. In one embodiment, the potential adjusting circuit 46 is a voltage regulator chip. However, embodiments of the invention encompass any circuit capable of receiving a first input voltage and outputting a second, different voltage or potential.

The detection circuit 48 is connected to a midpoint between the detection coil 18a and the resistor 38. The detection circuit 50 is connected to a midpoint between the resistor 40 and the detection coil 18b. In FIG. 3, a contact point among the detection coil 18a, the resistor 38, and the detection circuit 48 is represented as a node n4, and a contact point among the resistor 40, the detection coil 18b, and the detection circuit 50 is represented as a node n5.

Figure 5A:
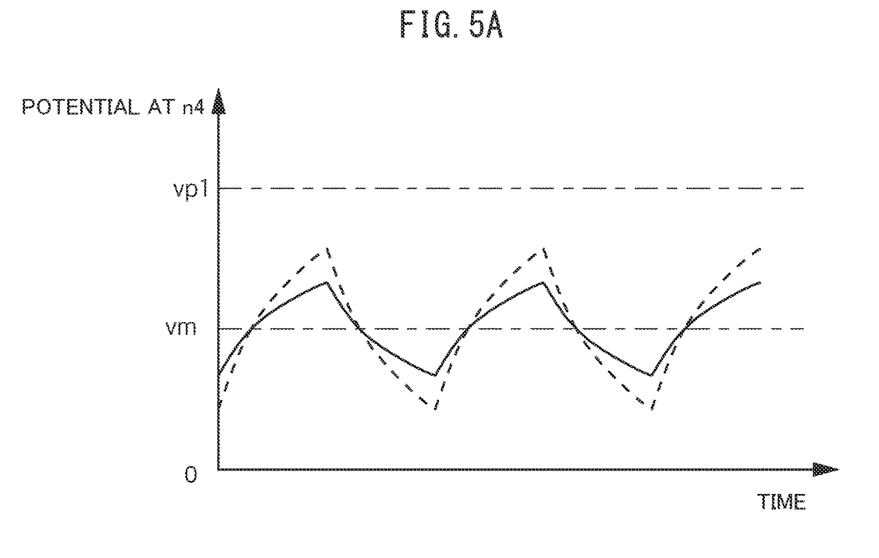
FIGS. 5A and 5B show graphs of examples of changes with time of a potential between a pair of detection coils.
Figure 5B:
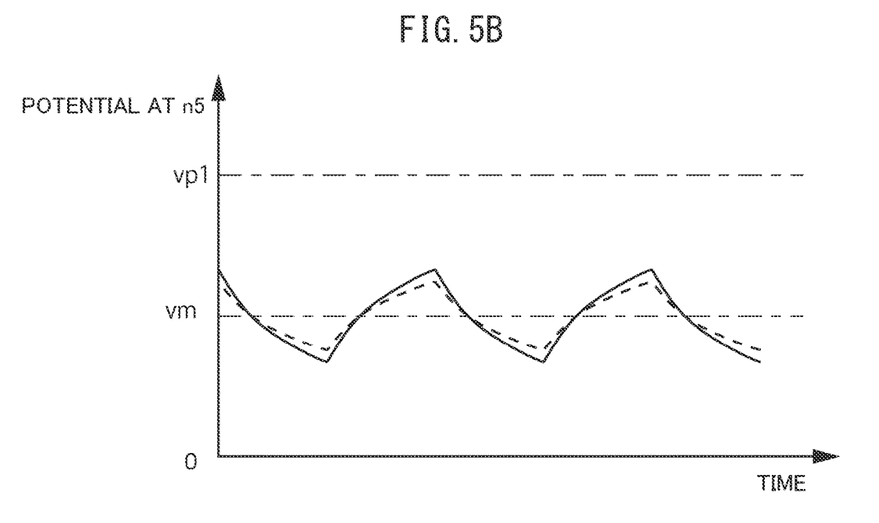

FIGS. 5A and 5B show graphs of examples of changes with time of potentials at the node n4 and the node n5. In FIGS. 5A and 5B, solid lines represent examples of changes with time of the potentials at the nodes n4 and n5 when no torque applies on the substrate 12. In FIGS. 5A and 5B, broken lines represent examples of changes with time of the potentials at the nodes n4 and n5 when a torque applies on the substrate 12.

As described with reference to FIGS. 4A and 4B, in this embodiment, the potentials at the nodes n1 and n2 alternately change to the potential vp1 and the ground potential (0 V). With reference to FIG. 3, the potential at the midpoint (node n3) between the resistor 38 and the resistor 40 is set by the potential adjusting circuit 46 at the intermediate potential vm between the potential vp1 and the ground potential. Therefore, as shown in FIGS. 5A and 5B, the potentials at the nodes n4 and n5 fluctuate with reference to the intermediate potential vm. The potentials at the nodes n4 and n5 vary in opposite phases.

As described above, in this embodiment, when a torque applies on the substrate 12, a compressive stress thereby occurs in the magnetostrictive portion 26 and a tensile stress occurs in the magnetostrictive portion 28, for example. Therefore, the magnetic permeability of the magnetostrictive portion 26 decreases, and the impedance of the detection coil 18a decreases. In addition, the magnetic permeability of the magnetostrictive portion 28 increases, and the impedance of the detection coil 18b increases. In this case, as illustrated in FIGS. 5A and 5B, the amount of change of the potential at the node n4 increases, and the amount of change of the potential at the node n5 decreases.

With reference to FIG. 3, the detection circuits 48 and 50 detect the potentials at the nodes n4 and n5, and output detection signals sg1 and sg2 thereof to the adder circuit 52. In this embodiment, the detection circuits 48 and 50 output signals obtained by performing full-wave rectification and conversion to direct current (root-mean-square value) on signals indicating changes with time of the potentials at the nodes n4 and n5, for example, to the adder circuit 52 as the detection signals sg1 and sg2. In other words, in one embodiment, the detection circuits 48 and 50 include full-wave rectifier circuits and AC/DC converters to convert potentials at nodes n4 and n5 to the signals sg1 and sg2. However, embodiments of the invention encompass any detection circuit capable of converting an AC signal (such as at nodes n4 and n5) into an output signal of a predetermined range that is capable of being analyzed by an arithmetic circuit to generate an output corresponding to a torque value.

Figure 6A:
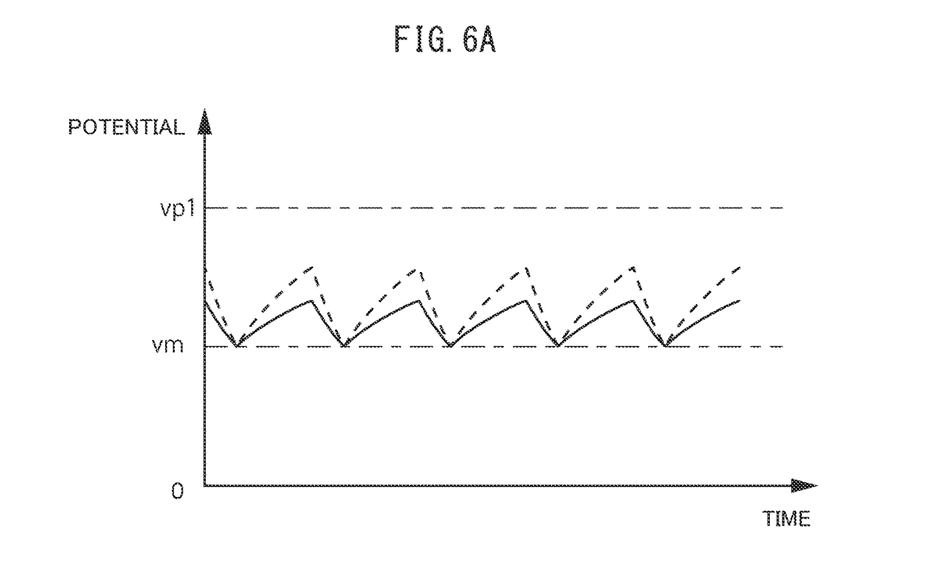
FIGS. 6A and 6B show graphs of examples of signals obtained by full-wave rectification in a detection circuit.
Figure 6B:
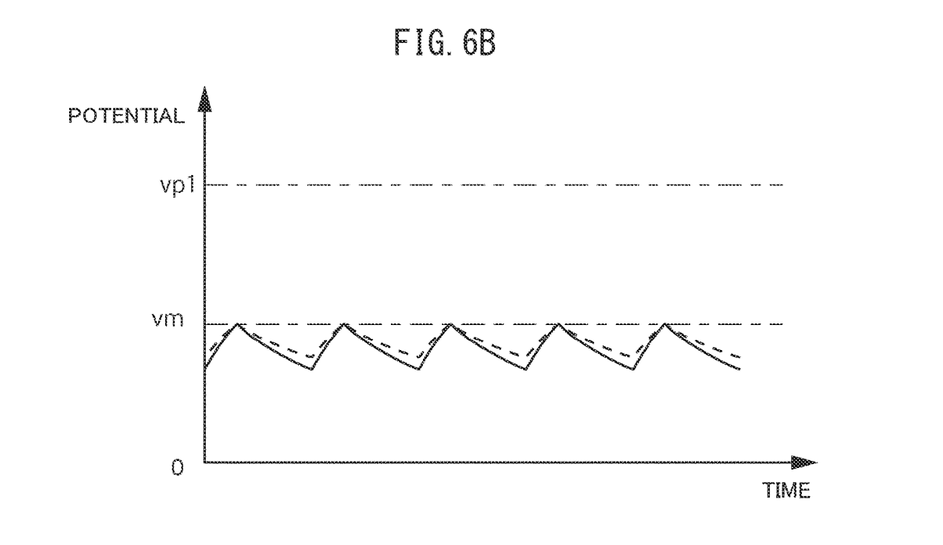

FIGS. 6A and 6B show graphs of examples of signals obtained by performing full-wave rectification in the detection circuits 48 and 50 on signals indicating changes with time of the potentials at the nodes n4 and n5. FIG. 6A shows a signal obtained by performing full-wave rectification on a signal indicating a change with time of the potential at the node n4. FIG. 6B shows a signal obtained by performing full-wave rectification on a signal indicating a change with time of the potential at the node n5. Signals represented by solid lines in FIGS. 6A and 6B correspond to potentials represented by the solid lines in FIGS. 5A and 5B. Signals represented by broken lines in FIGS. 6A and 6B correspond to potentials represented by the broken lines in FIGS. 5A and 5B.

In this embodiment, the detection circuits 48 and 50 perform the full-wave rectification using the intermediate potential vm as a reference potential. Specifically, with reference to FIGS. 3, 5A, and 6A, the detection circuit 48 inverts, for example, a potential lower than the intermediate potential vm in detected potentials at the node n4, using intermediate potential vm as a reference. With reference to FIGS. 3, 5B, and 6B, the detection circuit 50 inverts, for example, a potential higher than the intermediate potential vm in detected potentials at the node n5, using intermediate potential vm as a reference. The detection circuits 48 and 50 convert the signals subjected to the full-wave rectification as described above to direct currents (root-mean-square values) to thereby generate detection signals sg1 and sg2.

With reference to FIG. 3, the adder circuit 52 generates an addition or sum signal sg3 based on the detection signals sg1 and sg2 output from the detection circuits 48 and 50, and outputs the addition signal sg3 to the arithmetic circuit 54. In this embodiment, the adder circuit 52 obtains a difference between the potential indicated by the detection signal sg1 and the intermediate potential vm (hereinafter referred to as a first potential difference) and a difference between the intermediate potential vm and the potential indicated by the detection signal sg2 (hereinafter referred to as a second potential difference). The adder circuit 52 obtains a difference between the first potential difference and the second potential difference, and outputs a signal indicating the obtained difference as the addition signal sg3 to the arithmetic circuit 54. In this manner, in this embodiment, the adder circuit 52 can detect a potential difference between the nodes n4 and n5 based on the detection signals sg1 and sg2 converted to direct current by the detection circuits 48 and 50. In the present specification, the adder circuit 52 may include logic gates in a processor chip or other semiconductor chip or a stand-alone semiconductor chip or circuit. Embodiments of the invention encompass any circuit capable of adding two signals to obtain a third signal representing the sum of the two signals.

Based on the addition signal sg3 output from the adder circuit 52, the arithmetic circuit 54 calculates a torque applying on the substrate 12. Specifically, in this embodiment, in a case where no torque applies on the substrate 12, the first potential difference between the potential indicated by the detection signal sg1 and the intermediate potential vm is approximately equal to the second potential difference between the intermediate potential vm and the potential indicated by the detection signal sg2. In this case, the adder circuit 52 outputs the addition signal sg3 indicating that the difference between the first potential difference and the second potential difference is approximately zero. On the other hand, in a case where a torque applies on the substrate 12, the first potential difference increases and the second potential difference decreases in accordance with the torque. That is, when the torque applying on the substrate 12 increases, the difference between the first potential difference and the second potential difference increases. From the foregoing relationships, in this embodiment, the arithmetic circuit 54 can calculate a torque applying on the substrate 12 based on the difference indicated by the addition signal sg3 between the first potential difference and the second potential difference. In the present specification, the arithmetic circuit 54 may include logic circuitry in a processor chip, and may include instructions stored in memory of the processor chip or connected to the processor chip. For example, a torque value may take into account fixed characteristics of the substrate 12 that may be represented by a value saved in non-erasable memory in a processor chip or may be stored in external memory connected to the processor chip. In one embodiment, a predetermined formula is stored in memory and applied by the arithmetic circuit 54 to the addition signal sg3 to generate the torque value of torque applied to the substrate 12. Embodiments of the invention encompass any arithmetic circuit 54 capable of obtaining a torque value of torque applied to the substrate 12 based on a value sg3 obtained from the detection signals sg1 and sg2.

(Advantages of Embodiments)

In the torque sensor 10, a torque applying on the substrate 12 causes a tensile stress or a compressive stress to occur in the magnetostrictive portion 26 and the magnetostrictive portion 28. Accordingly, the magnetic permeabilities of the magnetostrictive portion 26 and the magnetostrictive portion 28 change. As a result, values of currents flowing in the detection coil 18a and the detection coil 18b change. The change in the values of currents flowing in the detection coils 18a and 18b causes the potential between the detection coil 18a and the detection coil 18b to change. In this embodiment, the detection circuits 48 and 50 detect a potential between the detection coil 18a and the detection coil 18b. More specifically, the detection circuit 48 detects a potential between the detection coil 18a and the resistor 38, and the detection circuit 50 detects a potential between the resistor 40 and the detection coil 18b. Based on the potentials detected by the detection circuits 48 and 50, a torque applying on the substrate 12 can be detected as described above.

In the torque sensor 10, each of the magnetostrictive portions 26 and 28 is constituted by a plating film. As described above, in a magnetostrictive torque sensor including a magnetostrictive portion constituted by a plating film, sensitivity can be increased by reducing the frequency of a current flowing in each coil. Accordingly, detection sensitivity of the torque sensor 10 can be increased by reducing the frequencies of currents flowing in the detection coils 18a and 18b. In this embodiment, for example, the frequencies of currents flowing in the detection coils 18a and 18b are adjusted to about 1 to 2 kHz.

When the frequencies of currents flowing in the detection coils 18a and 18b are reduced, impedances of the detection coils 18a and 18b decrease. Accordingly, currents easily flow in the detection coils 18a and 18b. However, in the torque sensor 10, the detection coil 18a and the detection coil 18b are connected to each other in series. Thus, in the torque sensor 10, an increase of currents flowing in the detection coils 18a and 18b can be suppressed even with reduction of the frequencies of currents flowing in the detection coils 18a and 18b, as compared to a conventional configuration as described in Patent Document 1 (i.e., a configuration in which a pair of coils is connected in parallel). As a result, the frequencies of currents flowing in the detection coils 18a and 18b can be easily adjusted.

In the manner described above, in the torque sensor 10, the frequencies of currents flowing in the detection coils 18a and 18b can be easily adjusted. Thus, even in a case where the plating film 14 is formed placing a priority on easiness of fabricating the torque sensor, detection sensitivity can be easily increased. That is, detection sensitivity of the torque sensor 10 can be increased without highly accurate formation of the plating film 14. As a result, the torque sensor 10 having high sensitivity and capable of being easily fabricated can be obtained.

In the torque sensor 10, the switching circuit 42 supplies the power supply voltage vp1 of one of a positive voltage or a negative voltage (positive voltage in this embodiment) to the detection coils 18a and 18b so that an alternating current can flow in the detection coils 18a and 18b. Thus, it is unnecessary to provide a power source for supplying a power supply voltage of the other voltage (negative voltage in this embodiment). As a result, fabrication costs of equipment including the torque sensor 10 (e.g., an electric motor-assisted bicycle) can be reduced.

In the torque sensor 10, a potential at a midpoint between the detection coil 18a and the detection coil 18b is set at the intermediate potential vm. Accordingly, the potential difference between the potential at the midpoint and the potential vp1 at the power supply terminal V1 and the potential difference between the potential at the midpoint and the ground potential can be made uniform. In this case, it is possible to prevent a voltage drop amount in the detection coil 18b from varying under the influence of variations in the voltage drop amount in the detection coil 18a. In addition, it is also possible to prevent the voltage drop amount in the detection coil 18a from varying under the influence of variations in the voltage drop amount of the detection coil 18b. That is, an influence of a voltage drop in the detection coil 18a on a voltage drop in the detection coil 18b can be prevented, and an influence of a voltage drop in the detection coil 18b on a voltage drop in the detection coil 18a can also be prevented. Accordingly, by detecting the differences between the potentials detected by the detection circuits 48 and 50 and the intermediate potential vm, changes in the magnetic permeabilities of the magnetostrictive portions 26 and 28 can be more accurately detected. As a result, a torque applying on the substrate 12 can be more accurately detected.

In the torque sensor 10, the resistance value of the resistor 38 is smaller than the resistance value of the detection coil 18a, and the resistance value of the resistor 40 is smaller than the resistance value of the detection coil 18b so that combined resistances of the detection coils 18a and 18b and the resistors 38 and 40 can be reduced. In this case, the amounts of currents flowing in the detection coils 18a and 18b can be maximized within a current value range in which the frequencies of the currents can be easily adjusted. Accordingly, magnetic fluxes generated by the detection coils 18a and 18b can be increased. As a result, sensitivity of the torque sensor 10 can be further increased.

In the torque sensor 10, the detection coils 18a and 18b are disposed in such a manner that a magnetic flux generated by the detection coil 18a and passing through the magnetostrictive portion 26 and a magnetic flux generated by the detection coil 18b and passing through the magnetostrictive portion 28 flow in one way (same direction) along the axis of the substrate 12. In a direction along the axis of the substrate 12, the distance between the detection coil 18a and the detection coil 18b is smaller than each of the length of the detection coil 18a and the length of the detection coil 18b. In this case, the magnetic flux generated by the detection coil 18a interferes with the magnetic flux generated by the detection coil 18b so that the magnetic flux passing through the magnetostrictive portion 26 and the magnetic flux passing through the magnetostrictive portion 28 can be sufficiently increased. As a result, sensitivity of the torque sensor 10 can be further increased.

In general, to increase detection sensitivity of a torque sensor, a magnetic flux generated by coils needs to be enhanced. To enhance the magnetic flux, it can be effective to increase the number of turns of coils or to increase the amount of a current flowing in the coils. However, as in the torque sensor 10 described above, when a pair of coils is connected in series, a current flowing in each coil decreases. Thus, a person skilled in the art who intends to increase sensitivity of a torque sensor by enhancing a magnetic flux would not connect a pair of coils in series. On the other hand, as described above, it was found through the investigation by the inventors of the present teaching that in a case where a magnetostrictive portion is constituted by a plating film, sensitivity of a torque sensor can be increased by adjusting frequency. In view of this, the inventors studied a relationship among the values of currents flowing in a pair of coils, the frequencies of the currents, and sensitivity of a torque sensor. As a result, the inventors found that an overflow of currents occurs in the pair of coils in a configuration in which the pair of coils is connected in parallel and the frequencies of currents flowing in the pair of coils are reduced. The inventors also found that in terms of increasing sensitivity of the torque sensor, adjustment of the frequencies of currents is more effective than adjustment of the values of currents flowing in the coils. Based on the findings, the inventors have arrived at a technical idea of intentionally employing a serial connection of coils, which causes a decrease in current value. That is, the present teaching is a technical idea first obtained by finding a relationship between a plating film and frequency.

(Other Embodiments)

The embodiment described above is directed to the case where an alternating current is caused to flow in the detection coils 18a and 18b and the resistors 38 and 40 by using a direct current power supply. Alternatively, an alternating current may be caused to flow in the detection coils 18a and 18b and the resistors 38 and 40 by using an alternating current power supply.

Although the embodiment described above is directed to the case of using the tubular substrate 12, a columnar substrate may be used.

Although the embodiment described above is directed to the case where the torque sensor 10 includes the individual circuit board 22, the torque sensor 10 may not include the circuit board 22. For example, in a case where the torque sensor 10 is mounted on an electric motor-assisted bicycle, a control board of the bicycle may include the configuration of the circuit board 22.

The embodiment described above is directed to the case where the switching circuit 42 including a pair of p-channel MOSFETs and a pair of n-channel MOSFETs, generates an alternating current. However, the configuration of the switching circuit 42 is not limited to the above example, and various known switching circuits may be used.

In the embodiment described above, the torque sensor 10 detects potentials at two points between the detection coil 18a and the detection coil 18b, and based on the detection results, obtains a torque applying on the substrate 12. Alternatively, the torque sensor 10 may detect potentials at three or more points between the detection coil 18a and the detection coil 18b to obtain a torque applying on the substrate 12. The torque sensor 10 may also obtain a potential at one point between the detection coil 18a and the detection coil 18b to obtain a torque applying on the substrate 12.

In the embodiment described above, the torque sensor 10 includes the resistor 38 disposed between the detection coil 18a and the detection coil 18b and is electrically connected to the detection coils 18a and 18b in series and the resistor 40 disposed between the resistor 38 and the detection coil 18b and is electrically connected to the resistor 38 and the detection coil 18b in series. Alternatively, the torque sensor 10 may not include the resistors 38 and 40.

In the embodiment described above, the distance between the detection coil 18a and the detection coil 18b is smaller than each of the length of the detection coil 18a and the length of the detection coil 18b. Alternatively, the distance between the detection coil 18a and the detection coil 18b may be larger than each of the length of the detection coil 18a and the length of the detection coil 18b.

The configuration of the substrate 12, the plating film 14, the bobbin 16, and the case 20 of the torque sensor 10 described in the above embodiment are merely examples. Accordingly, the substrate 12, the plating film 14, the bobbin 16, and the case 20 may have any configuration as long as magnetic fluxes passing through the magnetostrictive portions 26 and 28 can be generated by the detection coils 18a and 18b.

INDUSTRIAL APPLICABILITY

The present teaching can be used for various magnetostrictive torque sensors for detecting changes in the magnetic permeability of a plating film.

The invention claimed is:

1. A magnetostrictive torque sensor comprising:
a substrate having a columnar or tubular shape;
a first magnetostrictive portion and a second magnetostrictive portion each disposed on an outer peripheral surface of the substrate and constituted by a plating film;
a first coil that generates a magnetic flux passing through the first magnetostrictive portion;
a second coil that generates a magnetic flux passing through the second magnetostrictive portion and is electrically connected to the first coil in series;
a first resistor disposed between the first coil and the second coil and electrically connected to the first coil and the second coil in series;
a second resistor disposed between the first resistor and the second coil and electrically connected to the first resistor and the second coil in series; and
a detection circuit that detects a potential between the first coil and the first resistor and a potential between the second coil and the second resistor.

2. The magnetostrictive torque sensor of claim 1, further comprising:
a power supply that generates an alternating current and supplies a power supply voltage of one of a positive voltage or a negative voltage to the first coil and the second coil; and
a potential generating circuit that generates an intermediate potential between a potential of the power supply voltage and a ground potential, wherein
the power supply supplies the power supply voltage to the first coil and the second coil so that the alternating current flows in each of the first coil and the second coil,
the potential generating circuit sets a potential at a midpoint between the first coil and the second coil at the intermediate potential, and
the detection circuit detects a potential between the first coil and the midpoint and a potential between the second coil and the midpoint.

3. The magnetostrictive torque sensor of claim 1, wherein the first resistor has a resistance value smaller than a resistance value of the first coil, and
the second resistor has a resistance value smaller than a resistance value of the second coil.

4. The magnetostrictive torque sensor of claim 1, wherein each of the first coil and the second coil is disposed coaxially with the substrate,
the magnetic flux generated by the first coil and passing through the first magnetostrictive portion and the magnetic flux generated by the second coil and passing through the second magnetostrictive portion flow in one way along an axis of the substrate, and
in a direction along the axis, a distance between the first coil and the second coil is smaller than each of a length of the first coil and a length of the second coil.

5. The magnetostrictive torque sensor of claim 1, further comprising an arithmetic circuit that receives an input signal based on the a detection signal output from the detection circuit and applies a predetermined arithmetic formula to the detection signal to generate the torque value.

* * * * *